United States Patent
Majumdar et al.

(10) Patent No.: US 12,340,861 B2
(45) Date of Patent: Jun. 24, 2025

(54) SELECTIVE PER DIE DRAM PPR FOR MEMORY DEVICE

(71) Applicant: Micron Technology, Inc., Boise, ID (US)

(72) Inventors: Amitava Majumdar, Boise, ID (US); Greg S. Hendrix, Boise, ID (US); Ananadhavel Nagendrakumar, Boise, ID (US); Krunal Patel, Boise, ID (US); Kirthi Shenoy, Boise, ID (US); Danilo Caraccio, Milan (IT); Ankush Lal, Boise, ID (US); Frank F. Ross, Boise, ID (US); Adam D. Gailey, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 172 days.

(21) Appl. No.: 18/169,635

(22) Filed: Feb. 15, 2023

(65) Prior Publication Data
US 2024/0096439 A1 Mar. 21, 2024

Related U.S. Application Data

(60) Provisional application No. 63/408,728, filed on Sep. 21, 2022.

(51) Int. Cl.
*G11C 29/52* (2006.01)
*G06F 11/10* (2006.01)
*G11C 29/00* (2006.01)

(52) U.S. Cl.
CPC .......... *G11C 29/52* (2013.01); *G06F 11/1048* (2013.01); *G11C 29/76* (2013.01); *G11C 29/789* (2013.01)

(58) Field of Classification Search
CPC ....... G11C 29/52; G11C 29/76; G11C 29/789; G11C 2029/0411; G11C 29/4401; G06F 11/1048
See application file for complete search history.

(56) References Cited

U.S. PATENT DOCUMENTS

| | | | |
|---|---|---|---|
| 7,512,001 B2 | 3/2009 | Kwon | |
| 10,002,044 B2 * | 6/2018 | Hu | ........................ G06F 11/10 |
| 10,546,649 B2 | 1/2020 | Pope | |
| 10,824,499 B2 | 11/2020 | Hu | |
| 2014/0195852 A1 | 7/2014 | Gollub | |
| 2019/0237154 A1 * | 8/2019 | Choi | ........................ G11C 29/42 |

(Continued)

FOREIGN PATENT DOCUMENTS

TW 202314709 A 4/2023

*Primary Examiner* — Jay W. Radke (57) ABSTRACT

In a compute express link (CXL) memory controller system, a system and method to identify memory errors which may require soft package repair or hard package repair to rows of DRAM memory. When data is written to a row of DRAM, the data is immediately and automatically read back and scanned for bit errors. If bit errors are identified, steps are taken to determine if the memory location requires no repair, soft repair, or hard repair. The data is corrected and written back to a new memory location which is memory-mapped to the original location, thus effecting the soft- or hard-repair. The present system and method does not repair the entire row of memory, but only repairs the specific die(s) that exhibit memory error in the row.

19 Claims, 10 Drawing Sheets

(56) References Cited

U.S. PATENT DOCUMENTS

| | | |
|---|---|---|
| 2021/0311833 A1 | 10/2021 | Bulusu |
| 2022/0100395 A1 | 3/2022 | Kim |
| 2022/0148674 A1 | 5/2022 | Qiao |
| 2022/0197739 A1 | 6/2022 | Ryu |
| 2022/0223222 A1 | 7/2022 | Qu |
| 2023/0100573 A1 | 3/2023 | Jeong |
| 2023/0134493 A1 | 5/2023 | Ghosh |
| 2024/0004757 A1 | 1/2024 | Lee |
| 2024/0095120 A1* | 3/2024 | Majumdar ............. G11C 29/76 |
| 2024/0096438 A1* | 3/2024 | Majumdar ........... G11C 29/789 |

* cited by examiner

| Opt. No | Identify | Permission/Response | SH PPR decision | PPR command | PPR execution |
|---|---|---|---|---|---|
| 1 | Host | Host (mailbox PPR) | Host | Host (mailbox) | Central Controller / PPR Logic |
| 2 | Central Controller / PPR Logic | Host (mailbox PPR). No Action if no response | Host | Host (mailbox) | Central Controller / PPR Logic |
| 3 | Central Controller / PPR Logic | Host (mailbox – ack/forget). PPR at reset only if ack | Central Controller / PPR Logic | Central Controller / PPR Logic | Central Controller / PPR Logic |
| 4 | Central Controller / PPR Logic | None. But wait for reset (done at boot time) | Central Controller / PPR Logic | Central Controller / PPR Logic | Central Controller / PPR Logic |
| 5 | Central Controller / PPR Logic | None. Do not wait for reset | Central Controller / PPR Logic | Central Controller / PPR Logic | Central Controller / PPR Logic |

SELECTIVE PER DIE DRAM PPR FOR MEMORY DEVICE

CROSS REFERENCE TO RELATED APPLICATIONS

This application claims benefit to U.S. Provisional Patent Application No. 63/408,728, filed Sep. 21, 2022, and entitled "Error Detection, Correction, and Media Management on CXL Type 3 Device", the disclosure of which is incorporated herein in its entirety by reference.

TECHNICAL FIELD

The following relates generally to one or more systems for memory. It relates, in particular, to error detection, correction, and more particularly to post-packaging repair of dynamic random access memory.

BACKGROUND

Memory devices (also referred to as memory media devices) are widely used to store information in various electronic devices such as computers, user devices, wireless communication devices, cameras, digital displays, and the like. Information is stored by programing memory cells within a memory device to various states. For example, binary memory cells may be programmed to one of two supported states, often corresponding to a logic 1 or a logic 0. To access information stored by a memory device, a component may read, or sense, the state of one or more memory cells within the memory device. To store information, a component may write, or program, one or more memory cells within the memory device to corresponding states.

Over time, memory cells may degrade, resulting in data corruption when data is read to memory or read back from memory. To compensate for this, memory such as dynamic random access memory (DRAM) may have reserved memory locations. These reserved memory locations may be deliberately not utilized when the DRAM is fresh from the factory, when the DRAM is originally packaged. Instead, these memory cells are reserved for what is called post-package repair (PPR). This means over the lifetime of the DRAM, the reserved memory cells may be substitute for original memory cells when the original memory cells show signs of repeated failure over time.

Application specific integrated circuits (ASICs) may be designed and used for many different purposes in computers, cell phones, and other digital systems and control systems. For example, an ASIC may regulate access to DRAM by a computer's central processing unit (CPU) or by a cell phone's microprocessor. As a further example, a compute express link (CXL) ASIC may function as a controller to both regulate dynamic memory and to integrate different digital memory circuits according to recently emerging hardware standards.

In some embodiments a computer's processor, including possibly a dedicated ASIC of a CXL controller, may be employed to implement post-package repair of DRAM.

BRIEF DESCRIPTION OF THE DRAWINGS

Advantageous designs of embodiment of the present disclosure result from independent and dependent claims, the description, and the drawing. In the following, preferred examples of embodiments of the disclosure are explained in detail with the aid of the attached drawings. The drawings, which are incorporated herein and form part of the specification, illustrate the present disclosure. Together with the description the drawings further serve to explain the principles of the disclosure, and to enable a person skilled in the relevant art(s) to make use of the disclosure.

DETAILED DESCRIPTION

While the illustrative embodiments are described herein for particular applications, it should be understood that the present disclosure is not limited thereto. Those skilled in the art and with access to the teachings provided herein will recognize additional applications, modifications, and embodiments within the scope thereof and additional fields in which the present disclosure would be of significant utility.

Figure 1:
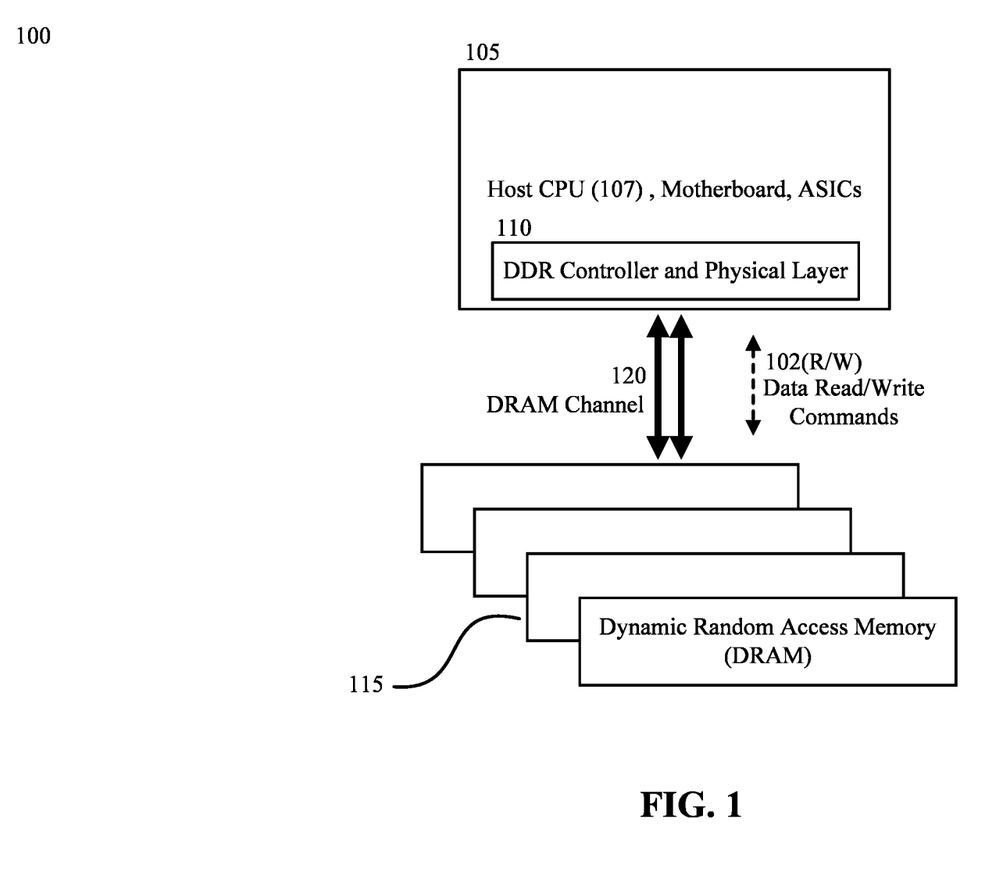
FIG. 1 illustrates a diagrammatic modular depiction of an exemplary legacy host computer system.

FIG. 1 illustrates a diagrammatic modular depiction of an exemplary legacy host computer system 100. The computer system 100 includes an exemplary motherboard 105 which has a host CPU 107 and various application specific integrated circuits (ASICs) known in the arts. The motherboard 105 may also include various data buses (including DRAM channel 120), physical ports, and expansion slots not shown in the figure. The motherboard 105 may include slots for insertion and communicative coupling of the DRAM 115 shown elsewhere in the figure. Among the ASICs on the motherboard 105 may be a DDR Controller and Physical Layer 110 (sometimes referred to as the "PHY"), which provide for direct data communications between the host CPU 107, and for direct read/write (R/W) commands 102 of the DRAM 115 by the host CPU 107. The direct data communications and the R/W commands 102 may be via the DRAM channel 120.

Figure 2:
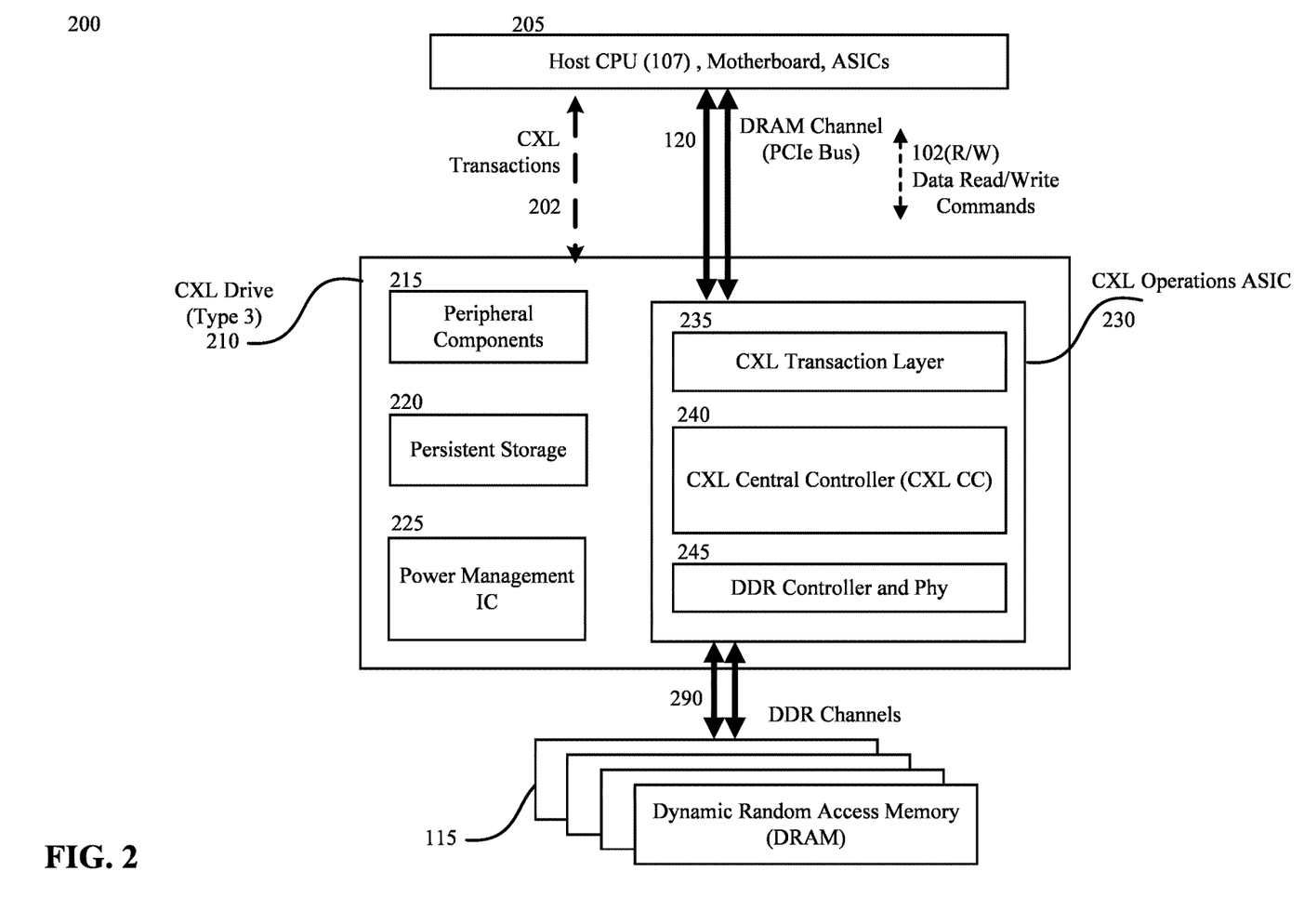
FIG. 2 illustrates a diagrammatic modular depiction of an exemplary legacy host computer system which includes CXL technology.

FIG. 2 illustrates a diagrammatic modular depiction of an exemplary legacy host computer system 200 which includes CXL technology. CXL is an open standard, cache-coherent interconnect for processors, memory, and memory expansion. CXL is defined by a series of commands and required memory command responses defined in a specification created by the Joint Electron Device Engineering Council (JEDEC) Solid State Technology Association and the CXL Consortium.

Essentially, CXL technology maintains memory coherency between memory space of a host CPU 107 and DRAM 115 on attached devices. The motherboard 105 and CPU 107 in combination may be referred to in the art as simply "the host device," and may have memory in addition to the CXL ASIC. A host device 205 is a source of data write commands (W) and data read requests (R), which comprise the CXL transactions 202. A service mastering bus (SMBus) not shown in the figure may communicate control commands and CXL ASIC status to/from the host device 205 CPU 107 from/to the CXL drive 210. The CXL drive 210 may be composed of multiple ASICs mounted to a shared board, or maybe a single ASIC with multiple sub-modules. In general, the CXL drive 210 reads and writes data from/to DRAM memory 115, or other kinds of suitable data storage, responsive to data requests from the host CPU 107.

The host device 205 of computer system 200 also may include an exemplary motherboard and various ASICs known in the art. The motherboard 105 may again include various data buses, including DRAM channel 120. DRAM channel 120 may be a Peripheral Connect Interface express bus (PCIe Bus). The device 205 may also have also physical ports and expansion slots not shown in the figure.

The motherboard may have mounted on board, or include slots for the insertion of, the CXL drive 210. As discussed throughout this document, the CXL drive 210 serves as a mediator and controller between the CPU 107 and the DRAM 115. The DRAM channel 120 is used to digitally ferry CXL transaction commands 202 between the host CPU 107 and the CXL drive 210. The motherboard may also include slots for insertion and communicative coupling of the DRAM 115 shown elsewhere in the figure. In turn, the CXL drive 210 and the DRAM 115 are typically coupled via double data rate (DDR) channels 290, which may themselves be integrated into the motherboard.

The CXL drive 210 may itself include an exemplary CXL Operations ASIC 230. The CXL Operations ASIC 230 may itself include a CXL transaction layer 235 configured to provide data interfacing for CXL transactions 202, and thereby for data R/W commands 102, to/from the host CPU 107. Unlike conventional main memory, where the CPU 107 makes transactions to DRAM 115 through the DRAM channel 120, a CXL drive 210 will have one or more ASICs to intercept CXL transactions 202, sent from CPU 107 through DRAM channel 120, and convert them to DRAM transactions. One function of the CXL operations ASIC 230 in a CXL drive 210 is to convert R/W commands 102, made through the CXL transactions 202, to DRAM requests.

The CXL operations ASIC 230 may also include a CXL central controller (CXL CC) 240 and a DDR Controller and Physical Layer 245. The motherboard 105 may be directly connected to CXL Operations ASIC 230 via DRAM channel 120. The DDR controller and physical layer 245 may operate similarly to the DDR controller and physical layer 110 of computer system 100 interfacing with the DRAM 115, as discussed above. Similarly, the CXL Operations ASIC 230 may be directly connected to DRAM 115 via DDR channels 290.

The CXL Operations ASIC may have logic blocks (shown as CXL CC 240) to perform additional tasks such as error correction, thermal management, media management, etc. The operations of the CXL CC 240 are discussed further below in this document in conjunction with FIG. 3 and other figures.

The CXL drive 210 may additionally include a variety of peripheral components 215 the details of which are beyond the scope of this document; a persistent storage module 220 which (as discussed further below) may be used to store a historical record of data errors; and a power management integrated circuit (IC) 225.

Figure 3:
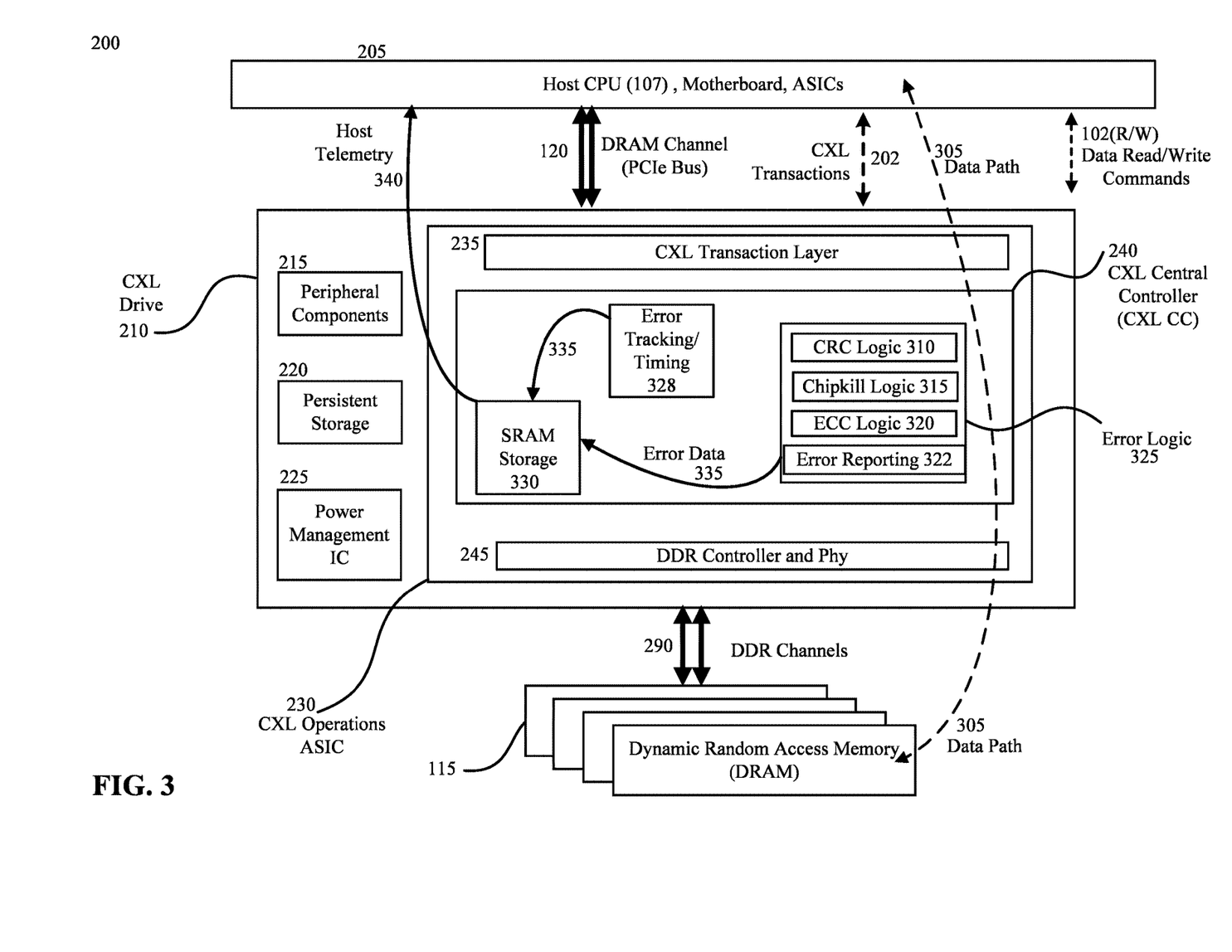
FIG. 3 illustrates a diagrammatic modular depiction of an exemplary legacy host computer system which includes CXL technology.

FIG. 3 illustrates another diagrammatic modular depiction of the computer system 200 of FIG. 2, this view including further details of the CXL operations ASIC 230. FIG. 3 also illustrates the broad, general data path 305 between the host CPU 107 and the DRAM 115. It will be seen that data R/W commands 102, and associated data, are transferred as CXL transactions from the host CPU 107 via CXL drive 210. In the process, both data to be written (W) and data being read (R) pass through the CXL CC 240. In particular, data being read (R) passes through the error logic block (ELB) 325.

The ELB 325 includes one or more data error processing modules, which may include but are not limited to exemplary modules for cyclic redundancy check (CRC) logic 310, chipkill logic 315, and error-correcting code (ECC) logic 320, which are configured to detect errors in data read from DRAM 115. The methods of CRC logic 310, chipkill logic 315, and ECC logic 320 rely in general on data typically stored in DRAM 115 with some redundant data bits, enabling detection, and sometimes data recovery, from single-bit or two-bit read errors. The details of these data detection and correction methods are beyond the scope of this document. It will be noted the employment of modules for CRC logic 310, chipkill logic 315, and ECC logic 320 for error correction is exemplary only and not limiting. Other, alternative, or additional error correction modules and algorithms may be employed within the scope of the present disclosure and claims.

In addition to identifying and correcting errors, the CXL CC 240 may include a module for error tracking/timing (ETT) 328. ETT 328 may identify the types, times, numbers, and the transaction types of errors detected, and associate these errors with specific memory locations. In an embodiment, ETT 328 may instead be an element of the ELB 325.

Each of these logic blocks may provide not only error detection but can also report details of each error, such as address, data, transaction type etc. Reporting may be handled by an error reporting block 322. CXL CC 240 requires error telemetry to be reported to the host (on demand or through interrupts). The CXL CC 240 may also include static random access memory (SRAM) storage 330. SRAM storage 330 maintains short-term storage of detected memory data errors, which is received as error reporting data 335 and reported via host-telemetry 340 to host CPU 107. As may be useful in some embodiments, additional error tracking/timing module(s) 328 may be provided as well.

The data path 305 of environment 300 depicts data moving between the host CPU 107 and DRAM 115 through the CXL drive 210. For example, data originating from the host CPU 107 may be communicated via DRAM channel 120, as packaged in CXL transactions, to CXL drive 210 its CC 240 and to DRAM 115 via DDR channels 290. In the event one or more logic layer CRC logic 310, Chipkill logic 315, ECC logic 320 of ELB 325 detects an error, error reporting block 322 may signal SRAM storage 330 with error data 335. Thereafter SRAM storage 330 may signal host CPU 107 with host telemetry 340.

Figure 4A:
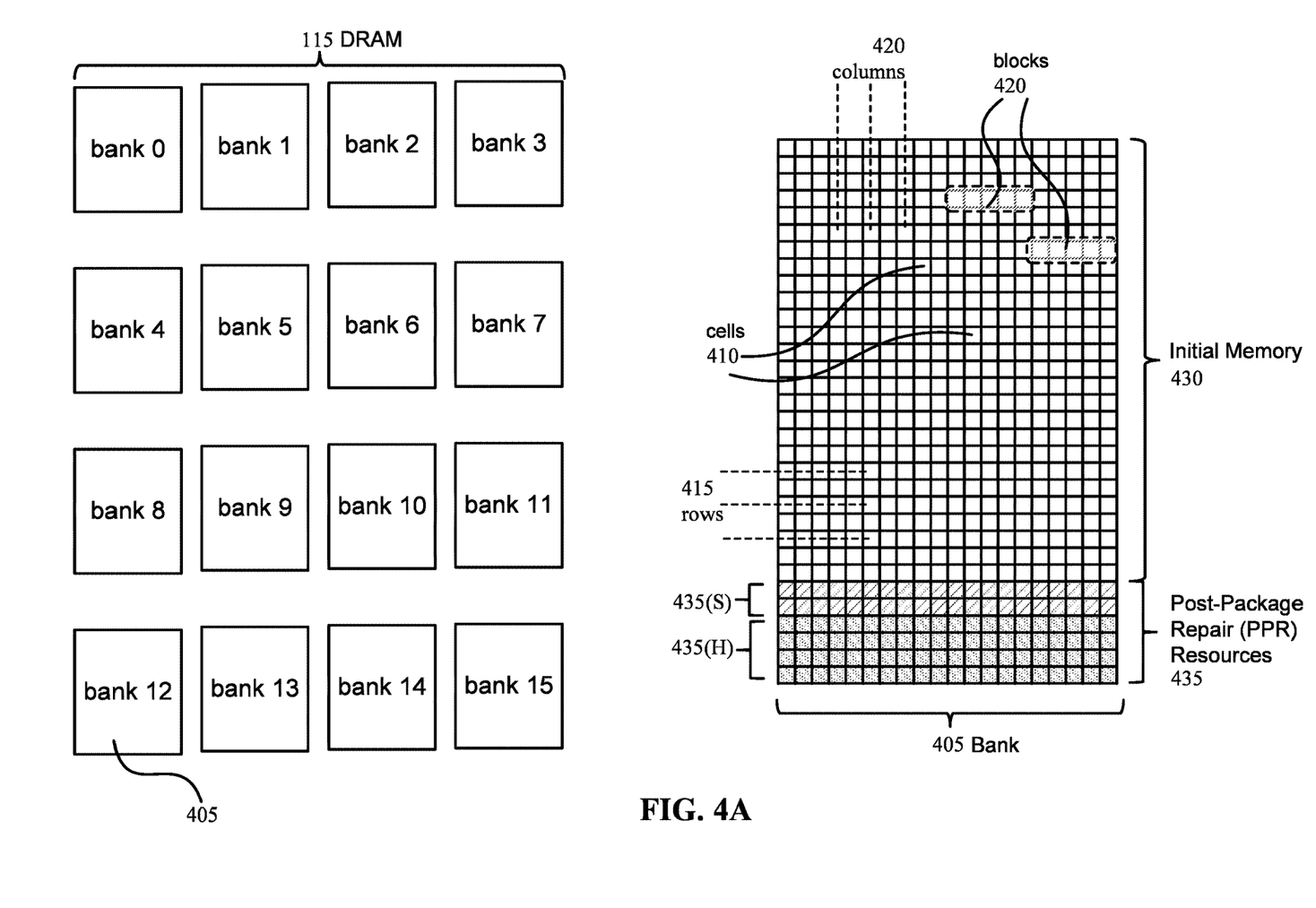
FIG. 4A illustrates a schematic drawing of system DRAM.

The present system and method is configured to provide support for post-packaged repair of damaged or malfunctioning DRAM memory locations. FIG. 4A illustrates a schematic drawing of a system of DRAM 115. DRAM 115 is arranged in arrays of banks 405. Each bank 405 has cells 410 of memory, arranged in rows 415 and columns 420. Data may be read from, or written to, columns 420 which may each have multiple cells 410.

As provisioned from the factory (upon initial packaging), each bank 405 is provisioned with numerous rows 415 of cells 410 forming initial memory 430. Memory 430 is immediately available for data storage. However, over time a row 415 of memory can fail. Therefore, each bank 405 is also provisioned with multiple additional rows 415 referred to as PPR resources 435. PPR resources 435 may be reserved rows to be used if needed for memory repair. These unused rows of PPR resources 435 in each bank 405 may be used for repair during manufacturing flow, or in the field if cells 410 from some rows 415 are found defective during field use. Executing a PPR (through JEDEC defined commands) will temporarily or permanently reassign the address of a damaged row 415 or columns 420 to one of these PPR resources 435. As shown in the figure, and as characterized further below, some PPR resources 435 may be designated for soft post-packaging repair (sPPR), while other PPR resources 435 may be designated for hard post-packaging repair (hPPR). These resources may be referred to as 435(S) for sPPR rows designated rows 415, and 435(H) for hPPR designated rows 415 respectively.

The present system and method pertains to the two types of post-package repair (sPPR and hPPR) named above: sPPR (soft PPR): when executed, an sPPR command will temporarily reassign the address of an apparently damaged row to a redundant row. However, upon a reset of the device 205, the CXL drive will forget the sPPR fix and come back to the original addressing scheme. (Exact command JEDEC defined.) Device reset is not required to implement the sPPR command; data is retained (except for the PPR seed row) and execution time is in nanoseconds. There is at least one but up to two sPPR rows 435(S) per bank 405.

hPPR (hard PPR): when executed, an hPPR command permanently reassigns the address of the damaged row to a redundant hPPR row 435(H). Once reassigned the change is permanent and cannot be reverted through reset. (Exact command JEDEC defined.) Device reset is advised but not required, data retention is not guaranteed, and execution time is approximately 2 sec. There is at least one, but up to thirty-four hPPR 435(H) per bank 405.

Figure 4B:
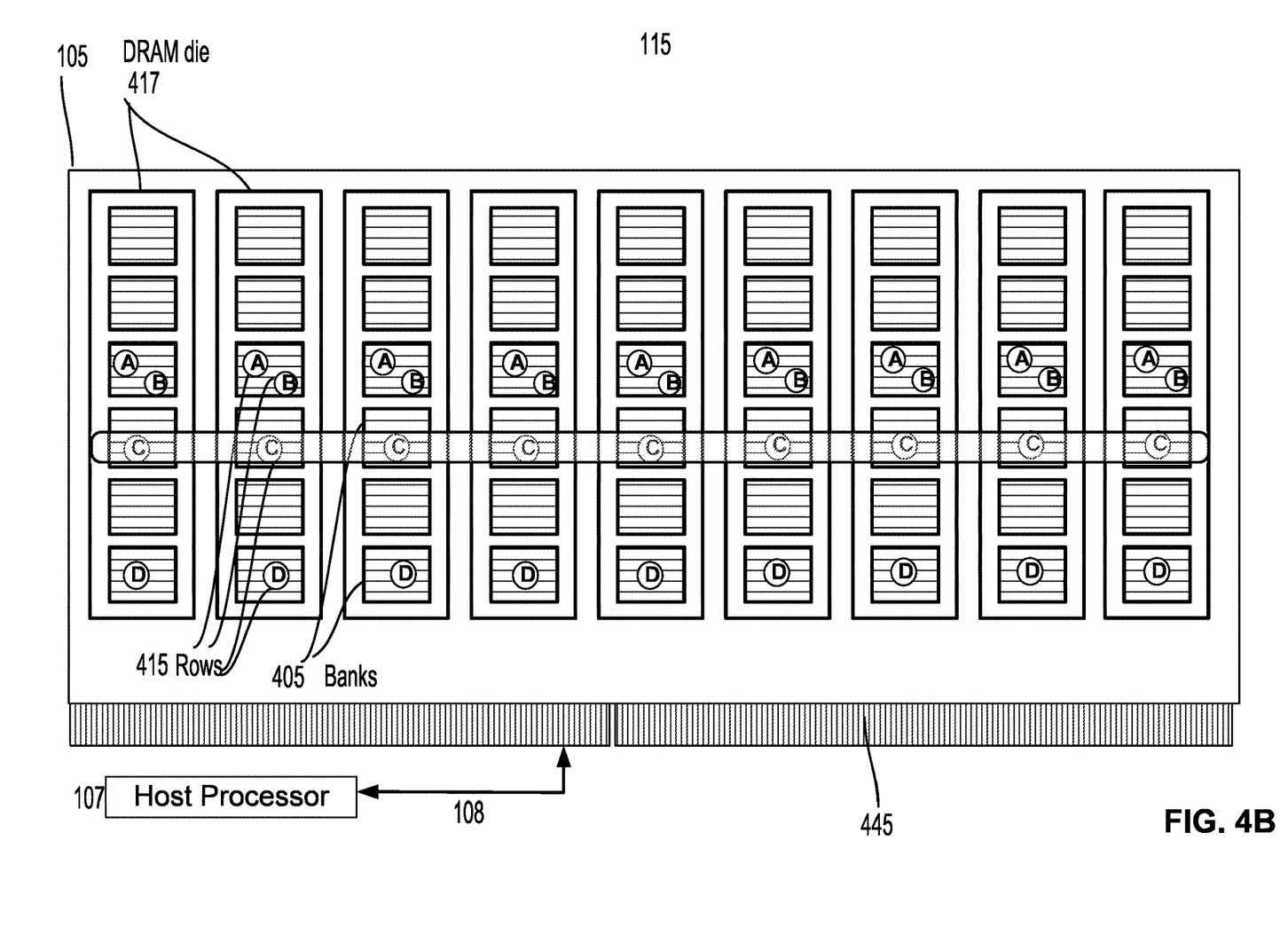
FIG. 4B illustrates a schematic drawing of system DRAM.

FIG. 4B provides another exemplary view of a system of DRAM 115. The DRAM is composed of separate DRAM dies 117 mounted on a circuit board 105. Data is stored in rows 415, for example (A), (B), (C), and (D), with each row spanning multiple dies 117. Typically, there are eight DRAM dies 117 for actual data storage and one DRAM die for parity.

A DRAM module 100 is usually operated based on a system channel. For example, a CXL module is operated on a CXL channel which is 80 bits. In legacy systems, even if a computer system only wants to copy data to one of the DRAM dies 117, (for example, a data copy for SPPR repair), those operations will have to happen on all dram dies 117 with a shared, same system channel/rank (which usually are ten-or-more dies, though only nine are shown in the figure). DRAM dies 115 have multiple banks 405. Each bank 405 has multiple data rows 415, with a full row spanning all the sequential dies 417.

The exemplary DRAM module 115 may be a CXL DRAM module 115. The exemplary DRAM module 115 may for example be suitable for installation in a PCIe slot (not shown in the figure) of a computer server or laptop computer (also not shown). Multiple DRAM dies 117 may be mounted on a circuit board 105 and are connected via the circuit board 105 to the pins 445. Pins 445 may form an electrical connection with a PCIe bus of the computer, thereby forming a digitally communicative connection with a host processor 107 of the computer. The DRAM module 115 may also have a CXL drive 210 connecting to the DRAM dies 117 via a command bus (not shown in the figure).

Figure 4C:
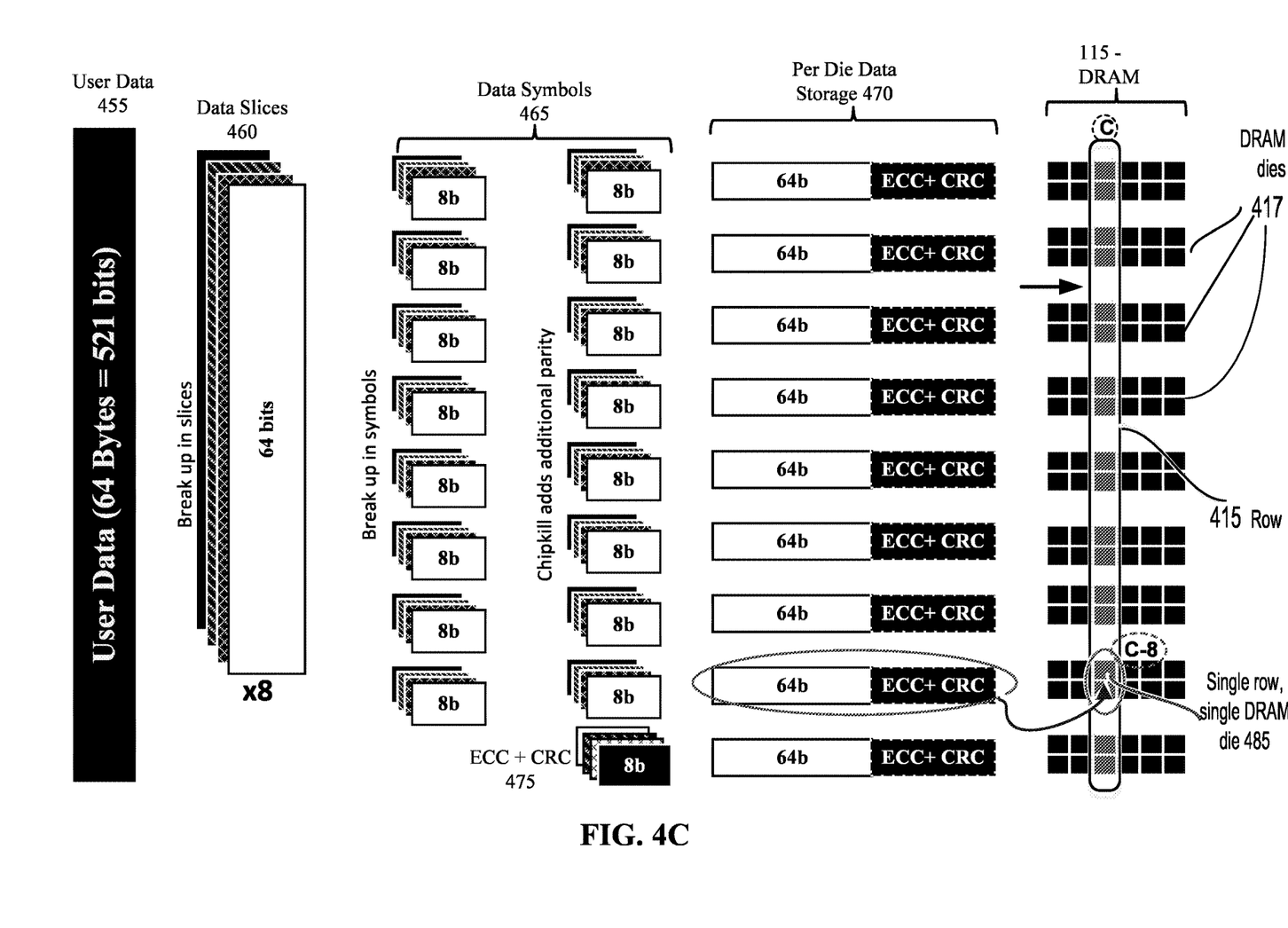
FIG. 4C illustrates per-die distribution of user data.

In terms of how user data 455 is stored and distributed on the DRAM dies 117, and with reference now to FIG. 4C: In the present system and method, user data 455 is carried to DRAM 115 via data write commands 102(W) via data path 305. The host CPU 107 transmits user data 455 in chunks or collections of 64 consecutive bytes. Each user data 455 is partitioned into eight 64-bit data slices 460, and each data slice in turn is initially partitioned in eight 8-bit data symbols 465. With the addition of error correcting code (ECC) and cyclic redundancy check (CRC) bytes, the original data slice 460 is represented as nine symbols per die data storage (PDDS) segments 470. In turn, each PDDS segment 470 is stored in one single row 415 of a single DRAM die 485. In the exemplary instances shown, the data symbol is stored in row (C) (see FIG. 4B).

As is apparent from FIG. 4C then, a single original data symbol 465 is stored in a distributed manner over nine DRAM dies 417, (C-1, . . . , C-9). As may be further apparent, it is possible then when reading a row, if a problem is found with the row, the problem and need for correction may exist in only a single die, for example (C-80).

Figure 5:
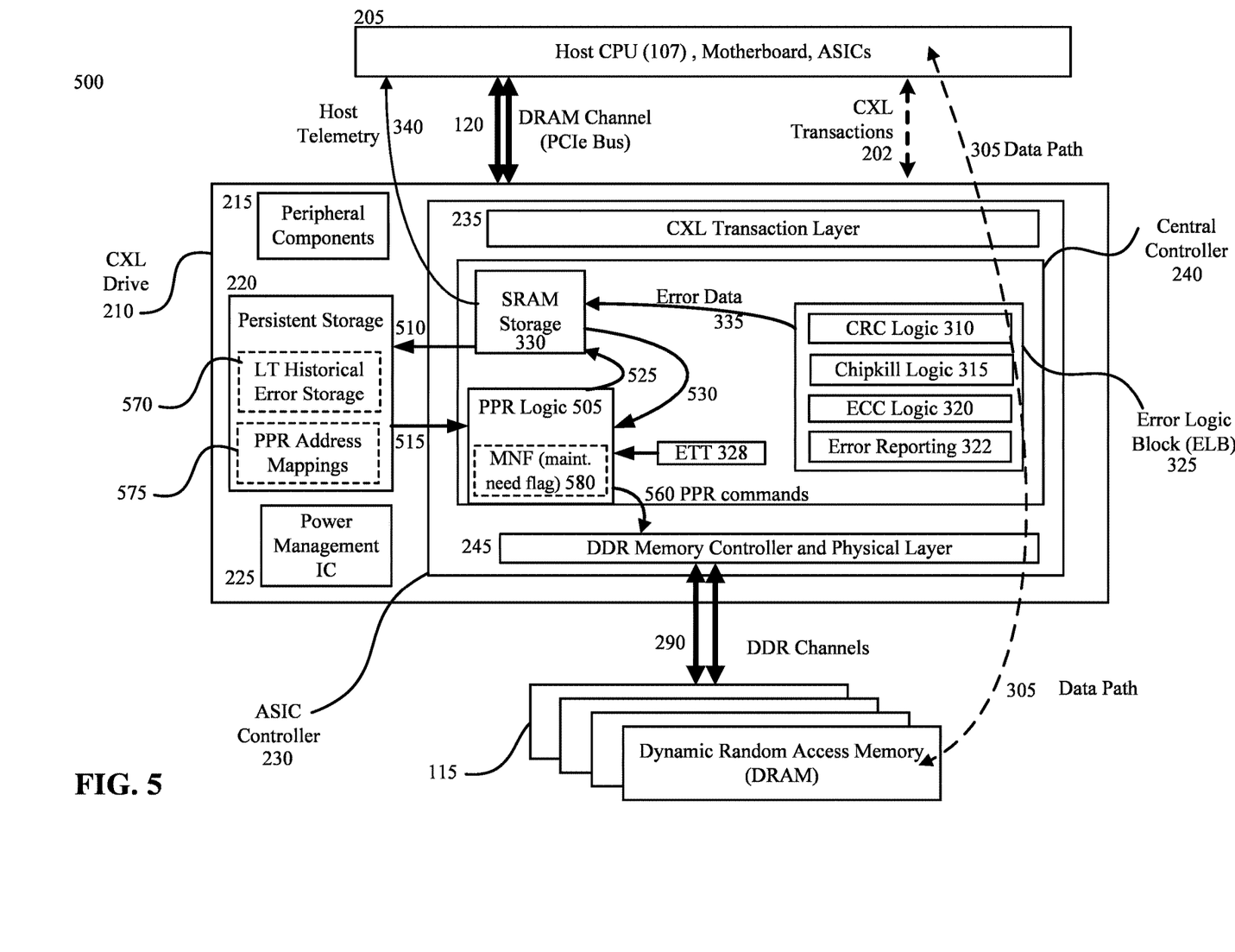
FIG. 5 illustrates a diagrammatic modular depiction of an exemplary host computer system which includes CXL technology and a post packaging repair logic module.

FIG. 5 illustrates a diagrammatic modular depiction of an exemplary host computer system 500 that includes CXL technology. Host computer system 500 is similar to the host computer system 200 discussed above in conjunction with FIGS. 2 and 3. The computer system 500, however, includes a PPR logic module 505 and illustrates additional operational features of the present system and method.

When DRAM 115 is attached directly to the host CPU 107 as main memory (as per FIG. 1 above), the host CPU 107 desirably includes the error detection logic and error correction logic (if implemented). If the host CPU 107 does predictive failure analysis, it does so by monitoring correctible error counts and addresses and may issue PPR commands according to its defined threshold level.

However, for CXL attached memory such as computer system 500 of FIG. 5, an ASIC within the CXL drive (such as PPR logic 505) may have the error detection and correction circuits. Although the error is reported to the host CPU 107, firmware on the ASIC can be enabled to monitor and identify rows needing repair. ASIC firmware, such as firmware of PPR logic 505, can also inform the host CPU 107 with a maintenance-needed flag (MNF) 580 in a common event record. The PPR logic 505 can also issue PPR commands to the DRAM 115 when the host CPU 107 responds to the maintenance request.

The present system and method provides for custom PPR logic 505 to mitigate memory errors. The PPR logic 505 may be implemented in hardware, or as firmware running on a dedicated microcontroller of the PPR logic 505. The PPR logic 505 is responsive to different types of DRAM errors, as described below:

DRAM hard error: In a DRAM row, one or more cells in the row may be damaged and therefore more often cause a bit flip. hPPR 435(H) may be used to correct such errors.

DRAM Soft Error: In a DRAM row, one or more cells may be weak (for example, having excess charge leakage, and so likely a lower retention ability). Such cells will not always cause bit flip, but if error data is collected over time from the same memory address, repeat fails may show up. sPPR rows 435(S) may be used to correct such errors.

Not a DRAM array error: Some errors in data reads are caused during transaction processing (transfer over the DRAM channel for example), or poor training. As such, they do not originate from the DRAM array. PPR resource should not be used in such a case.

The present system and method provides for persistent telemetry of data read errors. Error reporting data 335 temporarily stays in the SRAM storage 330 until it is sent to Host CPU 107, needs to be copied over to a persistent storage 220 (for example serial peripheral interface Not-Or (NOR) flash memory chips) within the CXL drive 210. A logic block will read the telemetry data from SRAM storage 330, exclude the non-array errors, and copy just the essential data 510 to the persistent storage 220. The frequency of the essential data copy 510 should not be high (example once every 24 hours), so that it does not lead to degradation of the persistent storage 220.

PPR Logic 505: A PPR logic block 505 will read the reported errors 530 from SRAM storage 330 and also read the historical errors 515 from the persistent storage 220. This PPR logic block 505 may identify rows 415 causing both hard and soft errors. It may raise or assert a maintenance-needed flag 580 indicating a need for PPR to be performed, and the PPR logic block 505 may execute the PPR by sending PPR commands 560 to the DDR physical layer 245. The PPR logic block 505 may also use the persistent storage 220 to store permanent address mappings 575 established during hard PPR, and which may be used when PPR is executed during CXL drive 210 initialization.

It will be noted that Chipkill logic 315 and ECC logic 320 can identify a specific memory address where an error occurs; since specific memory addresses (or ranges of memory addresses) are associated with a single DRAM die 485 of a specific row, a specific die 485 requiring repair can be identified.

Figure 6:
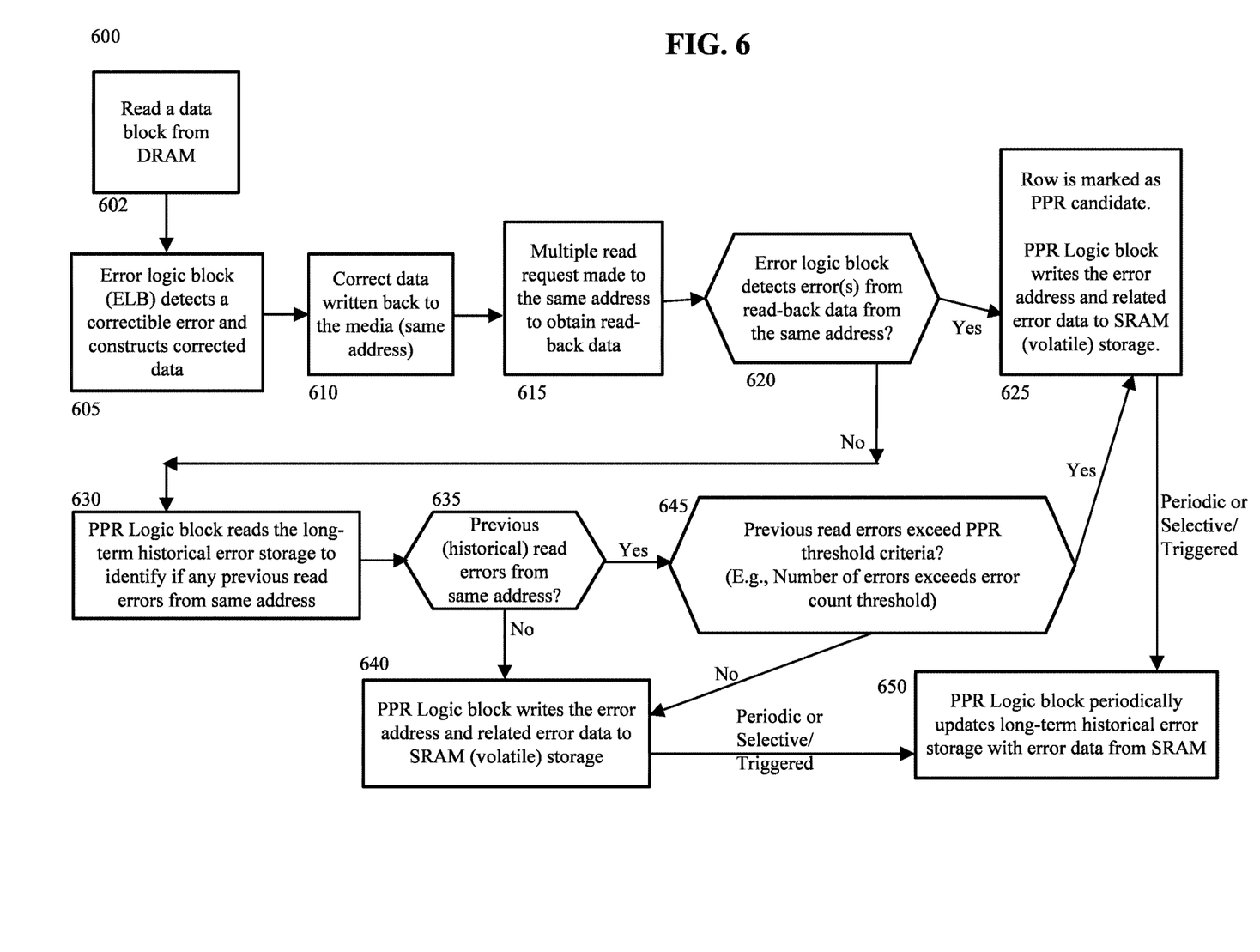
FIG. 6 illustrates a flowchart illustrating an exemplary method for identifying potential damage of a target memory die.

FIG. 6 illustrates a flowchart illustrating an exemplary method 600 for identifying potential damage of a target memory die. Various blocks of the method 600 may be performed by the host CPU 107, the PPR logic block 505, the ELB 325, and possibly other logic blocks and modules of the CC 240 and more generally the CXL drive 210.

In block 602, user data 455 may be read from DRAM 115 as initiated by a data read command (R) issued by the host CPU 107. Specifically, the data may be read from an exemplary memory address 'abed' of columns 420. In the appended claims, this memory block may be referred to as a first memory address. In block 605 of method 600, the ELB 325 detects a correctible error in the data read from columns 420 'abed' and using suitable algorithms the ELB 325 reconstructs (generates) the correct data. The corrected data is associated with a single DRAM die 485 of a specific row 415.

In block 610, PPR logic 505 may write the corrected data back to the columns 420 of DRAM 115, writing the data back to the same source address 'abed'. The write back of the corrected data may for example be via a PPR command 560 or other commands sent from PPR logic 505 to DRAM 115 via DDR memory controller and physical layer 245 and DDR channels 290.

In block 615, PPR logic 505 sends one or more read requests to the same source address from which the error originally came (in this exemplary instance, address 'abcd'). Multiple read requests may be sent to the same address, thus retrieving what is referred to herein a "read-back" data.

In block 620, the ELB 325 determines if there are any errors in the read-back data that was just read from the same address. If in block 620 it is determined that there are errors in the data read from the exemplary memory address 'abed' during the re-read process (block 615), then in block 625 the row containing that address is marked as a candidate for PPR. "Marking" the row as a PPR candidate may entail listing the row in suitable storage, such as SRAM storage 330, and possibly also long-term historical error storage 570.

If no read error was detected at block 620, in block 630 the PPR Logic block 505 reads the long-term historical error storage 570 to identify previous instances of errors (if any) from the same exemplary address 'abed'. In block 635 it may be determined if there were previous (historical) read errors at the same memory address.

If in block 635 it is determined that there were no previous (historical) read errors, then in block 640 the PPR logic block 505 writes the error address and related error data to a record in the long-term historical error storage 570.

If in block 635 it is determined that there were one or more previous (historical) read errors, the method proceeds to block 645. In block 645 it is determined if the previous historical read errors exceed a PPR threshold value, which may for example be a total number of errors or a time frequency of errors, or some combination of these and other factors. In an embodiment, a type of error, such as a number of bits in the error, may be taken into account as part of the threshold.

If in block 645 it is determined that the previous historical errors do not exceed the threshold, the method continues with block 640, where again the PPR logic block 505 writes the error address and related error data to a record in the long-term historical error storage 570. However, the row which displayed the memory error is not marked for repair.

If in block 645 it is determined that the previous historical errors do exceed the threshold, the method proceeds to block 625. In block 625 the row corresponding to the memory address is marked as a candidate for PPR. "Marking" the row as a PPR candidate may entail listing the row in suitable storage, such as SRAM storage 330, and possibly also long-term historical error storage 570, or as a field or other record in the maintenance need flag 580.

A method block 650 may be asynchronous from other method blocks, occurring periodically or when otherwise triggered by a signal from PPR logic block 505. When rows with data errors are first identified, the identification is made in volatile SRAM storage 330 (from where it may be transferred via host telemetry 340 to host CPU 107). In block 650, long-term historical error storage 570 is updated with memory error information from SRAM storage 330. Once a memory error has been identified, the present system and methods determine what kind of repair—sPPR or hPPR—is appropriate, and when the repair should be made.

Figure 7:
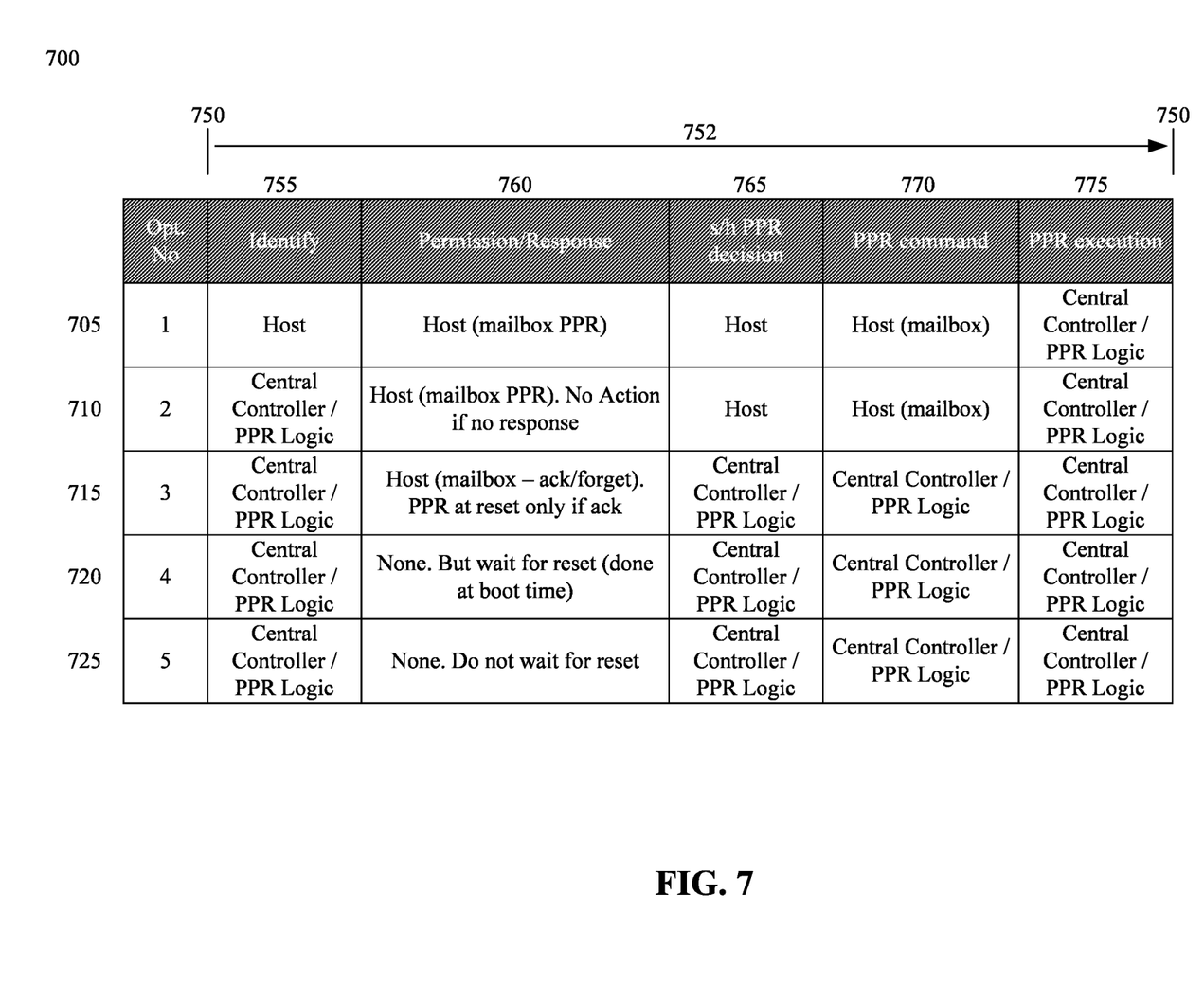
FIG. 7 illustrates a table of post-package repair (PPR) configurable options which may be utilized for PPR for identification, permission, command, response, and execution. The table also characterizes a method for PPR via a sequence timeline for a soft PPR or hard PPR.

FIG. 7 illustrates a table 700 of PPR configurable options 705 to 725 which may be utilized for PPR for identification, permission, command, response, and execution. In an embodiment, the choice of which option 705, 710, 715, 720, or 725 actually employed may be set by the host operating system via firmware, or by a user such as a system administrator via an application program used to configure the CXL drive 210. Table 700 also characterizes a method 750 via a sequence timeline 752. Timeline 752 entails a series of method blocks 755, 760, 765, 770, 775 (755 to 775), which also are headings for the table columns. These blocks 755 to 775 implement a soft PPR or hard PPR.

Block 755 entails identifying a memory error in the DRAM 115. The details of such identification have already been discussed above in conjunction with method 600 of FIG. 6 above. As taught in method 600, many of the blocks of identifying a DRAM error are performed or controlled by the CC 240, and in particular PPR logic 505 along with the ELB 325. However, in some embodiments, and as per the first configuration option 705, much or all of the logic entailed in identifying a memory error may be performed by the host processor 107. In all other options 710, 715, 720, and 725, the logic entailed in identifying memory errors is performed by the CC 240. When a memory error is identified, the method asserts a maintenance-needed flag 580 as already described above.

In a subsequent permission/response block 760, permission may be granted or not granted to perform a PPR, or a default permission may be set by the currently active option. In the first three options 705, 710, 715, permission to perform a PPR is determined by the host CPU 107, responsive to the maintenance-needed flag 580. The host processor 107 may direct the desired repair action with CXL mailbox commands. With option 705, if the host processor 107 does not respond, PPR is performed by default.

With option 710, if the host processor does not respond, no action is taken (no repair is done). With option 715, if the host processor issues an acknowledgment command, then PPR is done only when the CXL drive 210 is reset. With the fourth and fifth options 720, 725, permission to perform a PPR is not required from the host processor 107. With the fourth option 720, the PPR is performed only upon reset of the CXL drive 210. With fifth option 725, the PPR is performed responsive to the maintenance-needed flag 580 automatically.

For the first through third options 705, 710, and 715, a decision whether to perform a PPR may be based on a variety of factors. These may include, for example, whether or not any soft repair rows or hard repair rows are even available; and may also include an assessment of how likely it is that the memory address which caused the error is likely (or unlikely) to cause a repeat error. This latter determination (repeat error likelihood) in turn may be based on a variety of parameters and factors, including for example how many errors were detected at the memory address, both historically and upon immediate repeat memory reads; the frequency of historical error(s); and whether the error(s) were one bit, two bit, or higher bit number errors.

If in permission/response block 760 a decision is made to perform a post package repair, then in a subsequent soft/hard PPR block 765, a decision is made whether the memory repair will be a soft (temporary) post package repair or a hard (permanent) post package repair. For the first two options 705, 710, the choice is determined by the host processor 107. With the third through fifth options 715, 720, 725, the decision is determined by the CC 240 and may be made in particular by the PPR logic block 505. In some instances, the CXL drive 210 may be set to immediately perform a soft PPR, but with a hard PPR to follow at such time as the CXL drive 210 is reset (such as upon host device 205 reboot, or at some other time selected for a reset of CXL drive 210).

The criteria and operating conditions employed, by logic of the host CPU 107 and/or the PPR logic block 505, to choose between a soft PPR and a hard PPR may be similar to the factors which influence a decision to perform a PPR (hard or soft) at all. These factors may include, for example and without limitation: whether or not any soft repair rows or hard repair rows are even available, and if "yes", how many; an assessment of how likely it is that the memory address which caused the error is likely (or unlikely) to cause a repeat error.

This latter determination (repeat error likelihood) in turn may be based on a variety of parameters and factors, including for example how many errors were detected at the memory address, both historically and upon immediate repeat memory reads; the frequency of historical error(s); and whether the error(s) were one bit, two bit, or higher bit number errors. The choice may also be contingent on whether there are multiple errors to be corrected and establishing a priority among the errors. The choice may also be contingent on the fact that a hard PPR takes more time, and is more disruptive of memory operations, than a soft PPR.

In one exemplary case, a memory error may be assessed as serious enough (for example, because upon re-reads the number of errors exceeds an acceptable threshold) that a hard PPR is warranted; but the hard PPR is deemed excessively disruptive of current processor and memory operations. In that case, a soft PPR may be employed, along with setting a maintenance need flag 580 to indicate that the memory location should be subject to a hard PPR upon reboot or upon resetting of the CXL drive 210.

In another exemplary case, a memory error may be assessed as sufficiently likely to be transitory or infrequent that only a soft PPR is warranted; but the sPPR rows 435(S) may already be in use. In such a case, method logic may dictate a hard PPR be performed immediately, or for example within some number of clock cycles. Alternatively, method logic may assess a hard PPR would be excessively disruptive of current memory operations, so the PPR may be deferred until an sPPR row 435(S) for soft PPR becomes available.

In another exemplary case, while a hard PPR may be preferred, all hPPR rows 435(H) reserved for hard PPR may already be in use. In that instance, method logic may dictate a fall back to a soft PPR repair.

In general terms: If in permission/response block 760 a decision is made to perform a post package repair, then in a subsequent soft/hard PPR block 765, a decision is made whether the memory repair will be a soft (temporary) post package repair or a hard (permanent) post package repair. The decision may be made by the host CPU 107 if the first or second method options 705, 710 are being employed; or may be made by PPR logic 505 if the third, fourth, or fifth method option 715, 720, 725 are being employed.

Once the decision whether to perform a soft PPR or a hard PPR is made in block 665, in block 770 the PPR command is issued. The command may be issued as a CXL mailbox command issued by the host CPU 107 if the first or second method options 705, 710 are being employed; or may be issued by PPR logic 505 if the third, fourth, or fifth method option 715, 720, 725 are being employed.

In block 775 the PPR (soft or hard) is made to the DRAM 115 under control of various elements of the physical layer 245, including in particular PPR logic 505. This entails writing the corrected memory data to a suitable row from among the PPR resources 435(S/H), and remapping the damaged row memory address to the PPR resources 435. This may be accomplished via various address mapping registers of the CXL CC 240 and/or the DDR controller and physical layer 245 (not specifically illustrated in the figures). The corrected data is associated with a single DRAM die 485, known as the "repair die", of the specific row 415 (also labelled as row (C)), which may be the same die (8) where the error was initially identified in a different row. For example (not illustrated) the problem die may be die (8) of row B, or (B-8). As a result, the soft or hard PPR may be performed for only the single die (C-8), rather than be performed for all the dies (417) (C1-C9) in the affected row (C).

Persons skilled in the relevant arts will recognize that method 750 defined above may be implemented with a variety of variations in method blocks and program logic, consistent with this disclosure and the appended claims.

Figure 8:
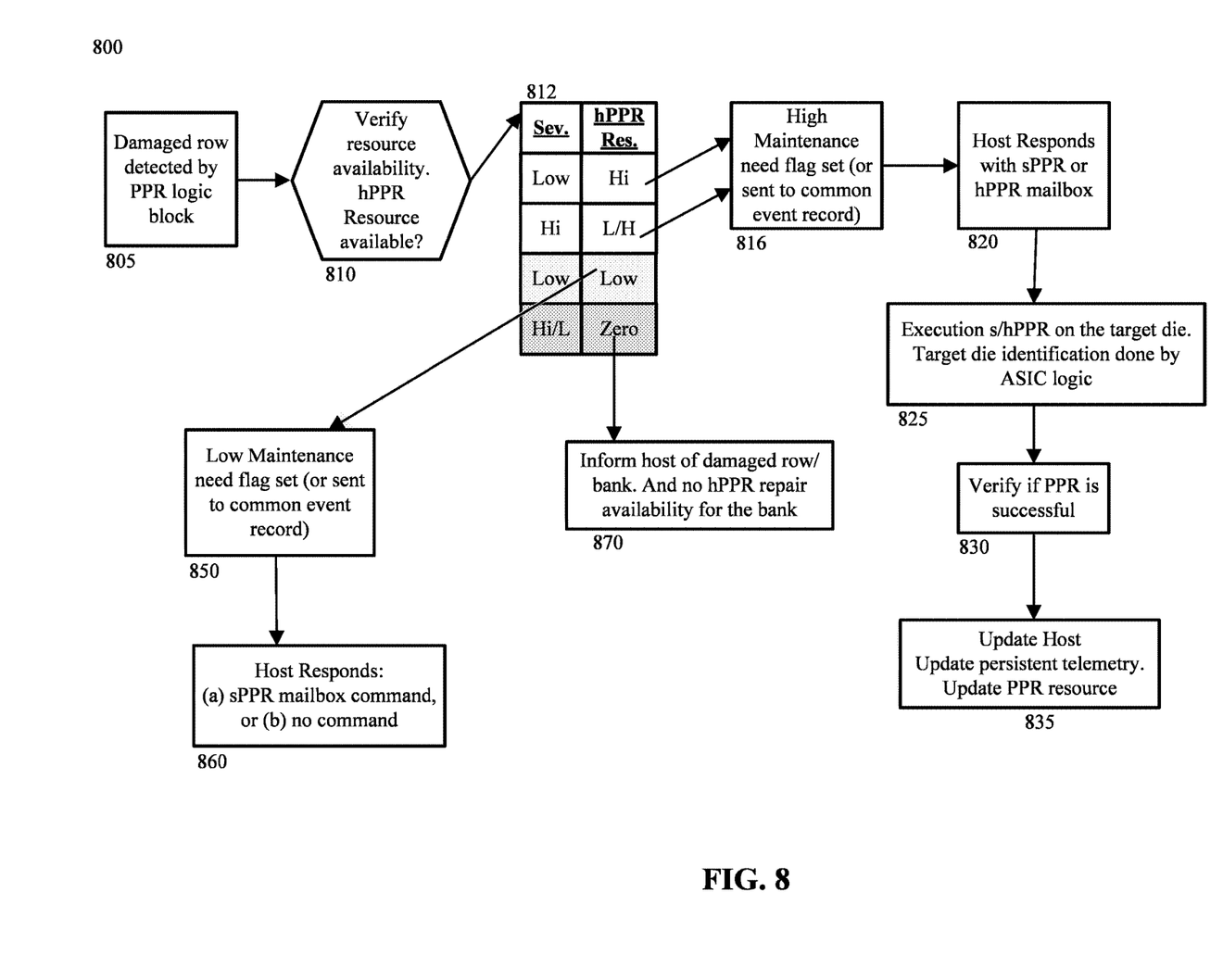
FIG. 8 illustrates a flowchart of an exemplary method to implement a soft or hard PPR.

FIG. 8, for example, illustrates a flowchart of an exemplary method 800 to implement a soft or hard PPR. In block 805 of method 800 the damaged row 415 is detected by PPR logic block 505, as may be done per method 600 of FIG. 6 above. The present method 800 may be based on a decision that hard PPR is in general preferable to a soft PPR. Then in block 810, a determination is made to verify if an hPPR resource 435(H) is available. It will be noted that an hPPR resource 435(H) is available if the appropriate die is available in that row. Since there are eight data storage dies per row, the availability of hPPR resources is increased as compared with a system where all the dies in the PPR row must be overwritten.

If in block 810 an hPPR resource 435(H) is available, the method may proceed to block 840 where a maintenance need flag 580 may be set, or a maintenance need signal may be sent to a common event record (not shown in the figures). At block 845 the host CPU 107 or PPR logic 505 responds with sPPR or hPPR mailbox command. The mailbox command may include both a parameter for the appropriate row and a parameter for the appropriate die in that row.

The decision as to whether to issue an hPPR or sPPR may be based on a variety of contextual factors. As already discussed above in conjunction with method 750 of FIG. 7, some of these factors may include the severity of the error, the severity of any errors also requiring correction, and the remaining number and type of available PPR resources.

From block 845 the method continues to block 825, which executes the sPPR or hPPR on the target row. As noted immediately above, in some embodiments of the present system and method, PPR is performed only on selected target dies in the target row.

From block 825, the method continues with block 830, which entails determining if the post package repair was successful. This may entail for example writing the corrected data to the appropriate memory row for the PPR, and then re-reading the data back several times to ensure the correct data is obtained.

From block 830, the method may continue with block 835, which may entail one or more system updates. These may include updating the host CPU 107 to indicate that the repair was performed; updating the long-term historical error storage 570; and updating the PPR address mappings 575.

Returning to block 810: If in block 810 an hPPR row 435(H) is not available, then the method may proceed to block 815. In block 815 the host processor 107 or the PPR logic 505 receives a signal that the row is damaged, but that no hPPR row 435(H) is available for repair. The method continues with block 820, where either the host processor 107 or the PPR logic 505 determines a soft repair is the only available option. The method then continues with blocks 825, 830, and 835 as above, where the repair is executed and validated.

Persons skilled in the relevant arts will appreciate the order and details of method blocks in method 750 and 800 are exemplary only, and the blocks necessary for soft PPR or hard PPR may be performed in other orders and with alternative decisions and nodes.

The use in some instances in this document of four-byte hexadecimal digits for memory locations is purely for convenience and not limiting; either logical or physical memory addresses may be any number of bytes suitable for digital logic systems; such as four bytes, eight bytes, sixteen bytes, thirty-two bytes, sixty-four bytes, or other byte lengths not enumerated. The present system and method may be employed with numerous different memory chip designs, numerous bus designs, numerous addressing systems and varied memory location schemas, both logical and hard-wired/physical.

In particular, the present system and method addresses the problem that physical memory locations can fail or degrade over time. In some embodiments of the present system and method, a "semiconductor memory system" may reside on a single circuit card or even a single ASIC, and may be referred to synonymously in brief as a "memory bank."

Alternative embodiments, examples, and modifications which would still be encompassed by the disclosure may be made by those skilled in the art, particularly in light of the foregoing teachings. Further, it should be understood that the terminology used to describe the disclosure is intended to be in the nature of words of description, rather than of limitation.

Those skilled in the art will also appreciate that various adaptations and modifications of the preferred and alternative embodiments described above can be configured without departing from the scope of the disclosure. Therefore, it is to be understood that within the scope of the appended claims, the disclosure may be practiced other than as specifically described herein.

For example, various aspects of the present disclosure can be implemented by software, firmware, hardware (including hardware represented by software such as Verilog or hardware description language instructions), or a combination thereof. After reading this description, it will become apparent to a person skilled in the relevant art how to implement the disclosure using other computer systems and/or computer architectures.

It should be noted the simulation, synthesis and/or manufacture of the various embodiments of this disclosure can be accomplished, in part, through the use of computer readable code, including general programming languages (such as C or C++), hardware description languages (HDL) including Verilog HDL, VHDL, Altera HDL (AHDL), or other available programming and/or schematic capture tools (such as circuit capture tools).

This computer readable code may be disposed within or imposed upon any known tangible computer usable medium including semiconductor, magnetic disk, optical disk (such as CD-read only memory ROM, DVD-ROM, or the like); and as a computer data signal embodied in a computer usable (e.g., readable) transmission medium (such as a tangible medium including digital, optical, or analog-based medium). As such, the code can be transmitted over communication networks including the Internet and intranets, from one tangible computer readable medium to another. It is understood the functions accomplished, and/or structure provided by the systems and techniques described above, may be represented in a core (such as a graphics processing unit core) that is embodied in program code and may be transformed into hardware as part of the production of integrated circuits.

It is to be appreciated the Detailed Description section, and not the Abstract section, is intended to be used to interpret the claims. The Abstract section may set forth one or more but not all exemplary embodiments of the present disclosure as contemplated by the inventor(s), and thus, is not intended to limit the present disclosure and appended claims in any way.

What is claimed is:

1. A tangible, non-transitory, computer readable storage medium comprising instructions which, when executed by a processor of a computer system, causes the processor to execute a method comprising:
   reading a data block from a first memory address of a dynamic random-access memory of the computer system;
   identifying an error in the data block via the processor of the computer system, wherein identifying the error comprises identifying both a row of the first memory address and a die where the error occurred within the row;
   correcting the error via the processor generating a corrected data;
   writing the corrected data back to the first memory location;
   reading the data back from the first memory address to obtain a read-back data;
   identifying whether the read-back data has an error or not;
   upon determining that the read-back data has an error:
     identifying that the die where the error occurred within the first memory address is in need of repair;
     upon identifying that the first memory address is in need of repair, repairing the die within the first memory address where the error occurred;
     recording the address of the memory error in a long-term historical storage of memory errors; and
     upon determining that the read-back data does not have an error, determining that the first memory address has a historical storage record of read errors or that the first memory address does not have a historical storage record of read errors.

2. The computer readable storage medium of claim 1, wherein the method further comprises:
   upon determining that the read-back data does not have an error, and that the first memory address does not have a history of read errors, recording the address of the memory error in the long-term historical error storage.

3. The computer readable storage medium of claim 1, wherein the method further comprises:
   upon determining that the read-back data does not have an error, and that the first memory address does have a history of read errors, identifying that the first memory address is in need of repair or that the first memory address is not in need of repair; and
   recording the location of the memory error in the long-term historical error storage.

4. The computer readable storage medium of claim 3, wherein the method further comprises identifying that the first memory address is in need of repair or that the first memory address is not in need of repair further comprises:
   identifying from the long-term historical storage of memory errors at least one of: a number of historical memory errors for the first memory address and a time frequency of historical memory errors for the first memory address; and
   determining that the first memory address is in need of repair based upon at last one of: the number of historical memory errors exceeding a designated error threshold and the time frequency of historical memory errors exceeding a designated time frequency threshold.

5. The computer readable storage medium of claim 4, wherein the method further comprises:
   upon determining that the first memory address is in need of repair, performing either a soft post package repair or a hard post package repair to the errored die of row in need of repair.

6. The computer readable storage medium of claim 1, wherein the method further comprises repairing the memory address further comprises performing either a soft post package repair or a hard post package repair to the errored die of row in need of repair.

7. The computer readable storage medium of claim 1, wherein the method further comprises identifying the die where the error occurred within the row comprises performing at least error analysis via chipkill logic and performing an error analysis via ECC logic.

8. A tangible, non-transitory, computer readable storage medium comprising instructions which, when executed by a processor of a computer system, causes the processor to execute a method comprising:
   reading a data block from a first memory address of a dynamic random access memory of the computer system;
   identifying via the processor of the computer system an error in the data block, wherein identifying the error comprises identifying both a row of the first memory address and a die where the error occurred within the row;
   further identifying that the first memory address is in need of post package repair (PPR);
   upon identifying that the first memory address is in need of PPR, wherein a repair comprises identifying a second memory address to replace the first memory address, establishing a priority among any errors and repairs to the errors;
   upon prioritizing the repairs, determining if a matching respective soft PPR memory location or a respective hard PPR memory location is available, including identifying if a die in in the second memory address corresponding to where the error occurred in the row is available for PPR; and
   upon determining that the respective soft or hard PPR memory location is available, storing a corrected data block in a corresponding die of the respective soft or hard PPR memory location.

9. The computer readable storage medium of claim 8, wherein the method further comprises:
   for a repair which has been prioritized as a soft PPR, and upon determining that a soft PPR memory location is not available, storing the corrected data block in the hard PPR memory location; and
   for a repair which has been prioritized as a hard PPR, and upon determining that a hard PPR memory location is not available, storing the corrected data block in a soft PPR memory location.

10. The computer readable storage medium of claim 8, wherein the method further comprises: maintaining a long-term historical storage of memory errors; and
   wherein the prioritizing the repair as a soft PPR or as a hard PPR further comprises determining a probability that the memory location is prone to becoming an uncorrectable memory location, wherein a memory location determined based on its error history to have a higher probability of becoming an uncorrectable memory is designated for a higher priority for hard PPR.

11. The computer readable storage medium of claim 10, wherein the method further comprises determining a probability that the memory location is prone to becoming an uncorrectable memory location comprises determining if the first memory address has more than a threshold number of memory errors based on its history of memory errors in the long-term historical error storage.

12. The computer readable storage medium of claim 8, wherein the method further comprises determining a likelihood the memory location is likely to become an uncorrectable memory location further comprises determining if the first memory address has more than a threshold frequency of memory errors based on its history of memory errors in the long-term historical storage.

13. The computer readable storage medium of claim 8, wherein the method further comprises determining a likelihood the memory location is likely to becoming an uncorrectable memory location further comprises determining a historical type of memory error for the first memory address.

14. A memory system, comprising:
a transaction layer configured to interface with a host processor;
a memory controller with a physical layer configured to interface with a dynamic random-access memory (DRAM);
an error logic block (ELB) configured to identify a data read error in a data block read from DRAM and provide error correction for the data read error from the DRAM data block, said identification comprising an identification of a specific die in a specific row where the data read error occurred;
a persistent storage configured to store a historical record of memory addresses which have displayed data read errors; and
a post-package repair (PPR) logic block configured to:
identify all of: (a) whether the data read error indicates a required post-package repair (PPR) of the data block memory address where the data read error occurred, (b) whether the required repair is a soft PPR or a hard PPR, (c) whether a PPR resource is available for the soft PPR or hard PPR, the identification of said availability comprising identifying whether a potential target row in a repair die is available to replace the specific row, and (d) whether to make the soft PPR or hard PPR based on the required repair and on the identifying of whether a PPR resource is available; and
perform the required post-package repair.

15. The memory system of claim 14, wherein:
the memory controller and physical layer are configured to read the data block from a first memory address of the DRAM;
the ELB is configured to identify an error in the data block;
the ELB is further configured to correct the error to generate a corrected data;
the PPR logic block is configured to:
write the corrected data back to the first memory location;
read the data back from the first memory location to obtain a read-back data;
identify whether the read-back data has an error or not;
upon determining the read-back data has an error:
identify that the first memory address is in need of repair;
upon identifying that the first memory address is in need of repair, repair the memory address at the repair die in the target row; and
record the location of the data read error in a long-term historical storage of memory errors; and
upon determining that the read-back data does not have an error, determine that the first memory location has a history of read errors or that the first memory location does not have a history of read errors.

16. The memory system of claim 14, wherein the PPR logic block is further configured to:
upon determining that the read-back data does not have an error, and that the first memory location does have a history of read errors, identify that the first memory address is in need of repair or that the first memory address is not in need of repair; and
record the location of the data read error in the long-term historical storage of memory errors.

17. The memory system of claim 14, wherein the PPR logic block identifies the first memory address is in need of repair or the first memory address is not in need of repair by:
identifying from the long-term historical storage of memory errors at least one of: a number of historical memory errors for the first memory address and a frequency of historical memory errors for the first memory address; and
determining the first memory address is in need of repair upon at least one of: the number of historical memory errors exceeds a designated error threshold and the time frequency of historical memory errors exceeds a designated frequency threshold.

18. The memory system of claim 14, wherein the PPR logic block is configured to, upon determining that the first memory address is in need of repair, perform either a soft post package repair or a hard post package repair at the repair die.

19. The memory system of claim 14, wherein the PPR logic block is configured to repair the memory address by performing either a soft post package repair or a hard post package repair at the repair die.

* * * * *